United States Patent
Jung et al.

(10) Patent No.: US 11,581,389 B2
(45) Date of Patent: Feb. 14, 2023

(54) DISPLAY DEVICE

(71) Applicant: Samsung Display Co., Ltd., Yongin-si (KR)

(72) Inventors: Somi Jung, Busan (KR); Byunghoon Kim, Hwaseong-si (KR); Junghyun Kim, Suwon-si (KR); Junehyoung Park, Seoul (KR); Hyunji Lee, Gimhae-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 156 days.

(21) Appl. No.: 17/100,915

(22) Filed: Nov. 22, 2020

(65) Prior Publication Data

US 2021/0265447 A1    Aug. 26, 2021

(30) Foreign Application Priority Data

Feb. 26, 2020   (KR) .................. 10-2020-0023611

(51) Int. Cl.
*H01L 27/32* (2006.01)
*G09G 3/3275* (2016.01)
(Continued)

(52) U.S. Cl.
CPC ....... *H01L 27/3276* (2013.01); *G09G 3/3275* (2013.01); *H01L 51/5246* (2013.01); *H05K 1/189* (2013.01)

(58) Field of Classification Search
CPC ............. H01L 27/3276; H01L 27/3246; H01L 27/3232; H01L 27/3223; H01L 51/5246; H01L 51/52; H01L 27/3279; H01L 51/56; H01L 51/0096; G09G 3/3275; G09G 3/3685; H05K 1/189; G02F 1/1303; G02F 1/13458; G02F 1/133311; G02F 1/1339;
(Continued)

(56) References Cited

U.S. PATENT DOCUMENTS 9,632,381 B2 *  4/2017  Kang ................. G02F 1/1339
10,180,607 B2 *  1/2019  Kong ................ G02F 1/13458
(Continued)

FOREIGN PATENT DOCUMENTS

EP   2806307   11/2014
EP   3112931   1/2017
(Continued)

OTHER PUBLICATIONS

Extended European Search Report dated Jul. 15, 2021, issued in European Patent Application No. 21158870.2.

*Primary Examiner* — Anne M Hines
*Assistant Examiner* — Jose M Diaz
(74) *Attorney, Agent, or Firm* — H.C. Park & Associates, PLC

(57) ABSTRACT

A display device includes: a first substrate including a display area and a non-display area at least partially surrounding the display area; a second substrate disposed on the first substrate; a pixel layer disposed on the display area between the first substrate and the second substrate; a seal disposed on the non-display area between the first substrate and the second substrate; a pad connected to the pixel layer and disposed on the non-display area; and a dummy element in a hole in the seal, the dummy element being disposed on the pad.

19 Claims, 10 Drawing Sheets

(51) Int. Cl.
*H01L 51/52* (2006.01)
*H05K 1/18* (2006.01)

(58) Field of Classification Search
CPC ............. G02F 1/1333; G02F 1/136286; H05L 2227/323
See application file for complete search history.

(56) References Cited

U.S. PATENT DOCUMENTS

| | | |
|---|---|---|
| 10,203,573 B2 | 2/2019 | Park et al. |
| 2014/0346445 A1 | 11/2014 | Cho |
| 2019/0204669 A1 | 7/2019 | Lee et al. |
| 2019/0204698 A1 | 7/2019 | Wang |
| 2019/0206970 A1 | 7/2019 | Baek |
| 2021/0028271 A1 | 1/2021 | Park et al. |

FOREIGN PATENT DOCUMENTS

| | | |
|---|---|---|
| KR | 10-2009-0041613 | 4/2009 |
| KR | 101365120 | 2/2014 |
| KR | 10-2014-0136737 | 12/2014 |
| KR | 20170034188 | 3/2017 |
| KR | 10-2021-0011561 | 2/2021 |

\* cited by examiner

DISPLAY DEVICE

CROSS-REFERENCE TO RELATED APPLICATION

This application claims priority from and the benefit of Korean Patent Application No. 10-2020-0023611, filed on Feb. 26, 2020 which is hereby incorporated by reference for all purposes as if fully set forth herein.

BACKGROUND

Field

Exemplary implementations of the invention relate generally to a display device and, more particularly, to a display device with a driver bonded to a side surface of a display panel.

Discussion of the Background

In general, a display device includes a display panel including pixels to display an image, a scan driver providing scan signals to the pixels, and a data driver providing data voltages to the pixels. The scan driver and the data driver are connected to the display panel. The scan driver generates the scan signals and provides the generated scan signals to the pixels. The data driver generates the data voltages and provides the generated data voltages to the pixels. The pixels receive the data voltages in response to the scan signals and display the image. The scan driver and the data driver are disposed in the area called a bezel area. In recent years, a technique that bonds the drivers to a side surface of the display panel is being developed to reduce the bezel area.

The above information disclosed in this Background section is only for understanding of the background of the inventive concepts, and, therefore, it may contain information that does not constitute prior art.

SUMMARY

Display devices constructed according to the principles and exemplary implementations of the invention have signals lines stably connected to a driver on a side surface of the display panel. For example, a dummy pattern may be electrically connected to pads at the end of the data lines, and connection pads are electrically connected to not only the pads but also the dummy patterns. Therefore, the contact area in which the display panel and the data driver are electrically connected to each other is increased. Thus, the contact resistance between the connection pad and the pad is decreased, and as a result, the display panel and the data driver can be stably connected to each other.

Additional features of the inventive concepts will be set forth in the description which follows, and in part will be apparent from the description, or may be learned by practice of the inventive concepts.

According to one aspect of the invention, a display device includes: a first substrate including a display area and a non-display area at least partially surrounding the display area; a second substrate disposed on the first substrate; a pixel layer disposed on the display area between the first substrate and the second substrate; a seal disposed on the non-display area between the first substrate and the second substrate; a pad connected to the pixel layer and disposed on the non-display area; and a dummy element in a hole in the seal, the dummy element being disposed on the pad.

The pixel layer may include: a pixel; a scan line connected to the pixel; and a data line connected to the pixel and extending to the non-display area, the data line including a part near or at an end of the data line connected to the pad.

The lower surface of the dummy element may be in contact with an upper surface of the pad.

The upper surface of the dummy element may be in contact with a lower surface of the second substrate.

The dummy element may include a dummy pattern, the hole may include a dummy hole, and at least one of the pad, the dummy pattern, and the dummy hole may be disposed in plural, and the pads, the dummy patterns, and the dummy holes may extend in a first direction.

The seal may include a sealing layer including a first sealing layer disposed on the first substrate having dummy holes in which the dummy patterns may be received; and a second sealing layer disposed on the first sealing layer.

The second sealing layer may be disposed on the first sealing layer to overlap the dummy patterns.

The data driver may be configured to communicate a signal to the pad, wherein the data driver may include: a flexible circuit board; a connection pad disposed on one surface of the flexible circuit board and connected to the pad; and a driving chip mounted on the flexible circuit board.

The connection pad may be electrically connected to a first side surface of the pad, which may face the connection pad, and a second side surface of the dummy pattern, which may face the connection pad.

The first side surface and the second side surface may be disposed in substantially a same plane.

The adhesive layer may be disposed between the connection pad and the first side surface and between the connection pad and the second side surface.

The adhesive layer may include: an adhesive film; and a plurality of conductive balls at least partially disposed in the adhesive film.

The dummy element may be integral with the pad.

The pixel layer may include an organic light emitting device.

The liquid crystal layer may be disposed between the first substrate and the second substrate.

The dummy element may include a metal material.

According to another aspect of the invention, a display device includes: a first substrate including a display area and a non-display area at least partially surrounding the display area; a second substrate disposed on the first substrate; a pixel disposed on the display area between the first substrate and the second substrate; a data line connected to the pixel on the display area and extending in a first direction to be disposed on the non-display area; a pad disposed on the non-display area and connected to at or near an end of the data line; a seal disposed on the non-display area between the first substrate and the second substrate; and a dummy element overlapping the seal and connected to the pad.

The dummy element may be received in a hole defined in the seal.

The data driver may be configured to communicate a data signal to the data line, wherein the data driver may include: a flexible circuit board; a connection pad disposed on one surface of the flexible circuit board and connected to the pad and the dummy element; and a driving chip mounted on the flexible circuit board, and the connection pad may be connected to a first side surface of the pad which may face the connection pad, and a second side surface of the dummy pattern which may face the connection pad.

The seal may include a sealing layer including an insulating material, and the dummy element may include dummy pattern including a metal material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
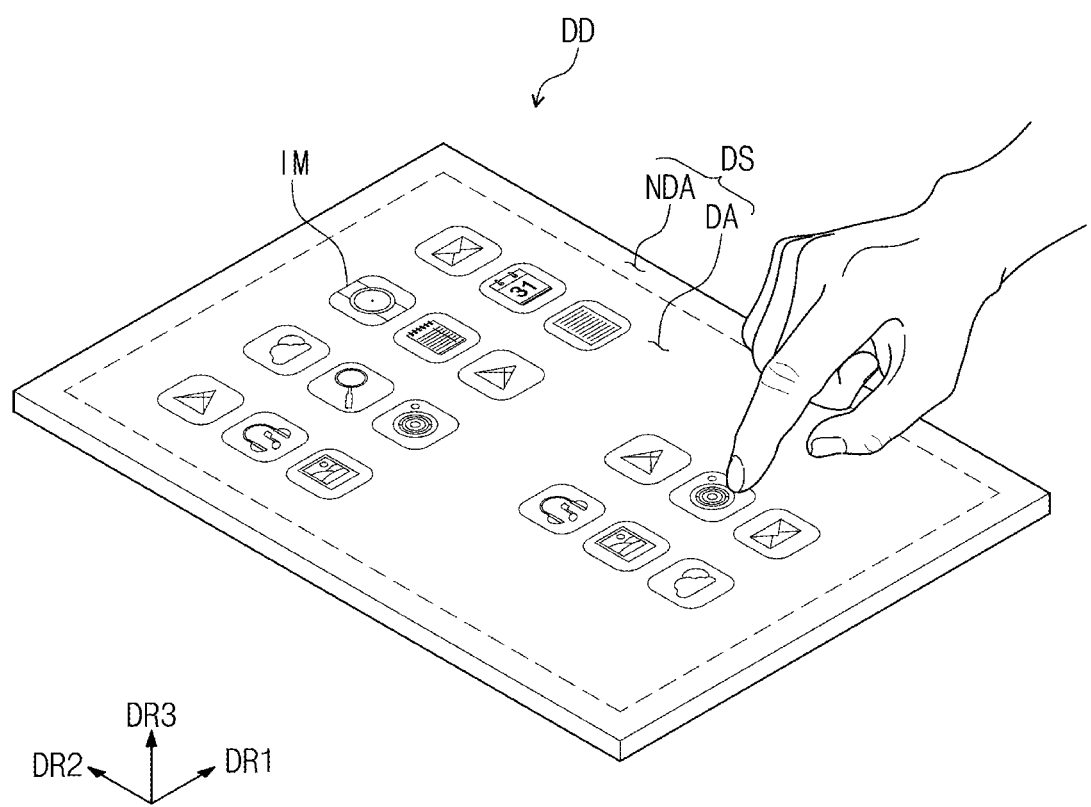
FIG. 1 is a perspective view of an exemplary embodiment illustrating a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment illustrating a display device DD constructed according to principles of the invention.

Referring to FIG. 1, the display device DD according to some exemplary embodiments may have a generally flat shape defined by short sides extending in a first direction DR1 and long sides extending in a second direction DR2 intersecting the first direction DR1. Hereinafter, the expression "when viewed in plan" may mean a state of being viewed in a third direction DR3 substantially perpendicular to a plane defined by the first direction DR1 and the second direction DR2. When viewed in plan, the display device DD may have a generally rectangular shape; however, it should not be limited thereto or thereby. The display device DD may have a variety of shapes, such as a generally circular shape or a generally polygonal shape.

An upper surface of the display device DD may be defined as a display surface DS and may be a plane defined by the first direction DR1 and the second direction DR2. Images IM generated by the display device DD may be provided to a user through the display surface DS.

The display surface DS may include a display area DA and a non-display area NDA around the display area DA. The display area DA may display the images, and the non-display area NDA may not display the images. The non-display area NDA may surround the display area DA and may define a bezel of the display device DD.

The display device DD may be applied to a large-sized electronic item, such as a television set, a monitor, or an outdoor billboard, and a small and medium-sized electronic item, such as a personal computer, a notebook computer, a personal digital assistant, a smartphone, or a tablet computer. However, the above-mentioned electronic items are merely exemplary, and the display device DD may be applied to other electronic items as long as they do not depart from the inventive concepts.

Figure 2:
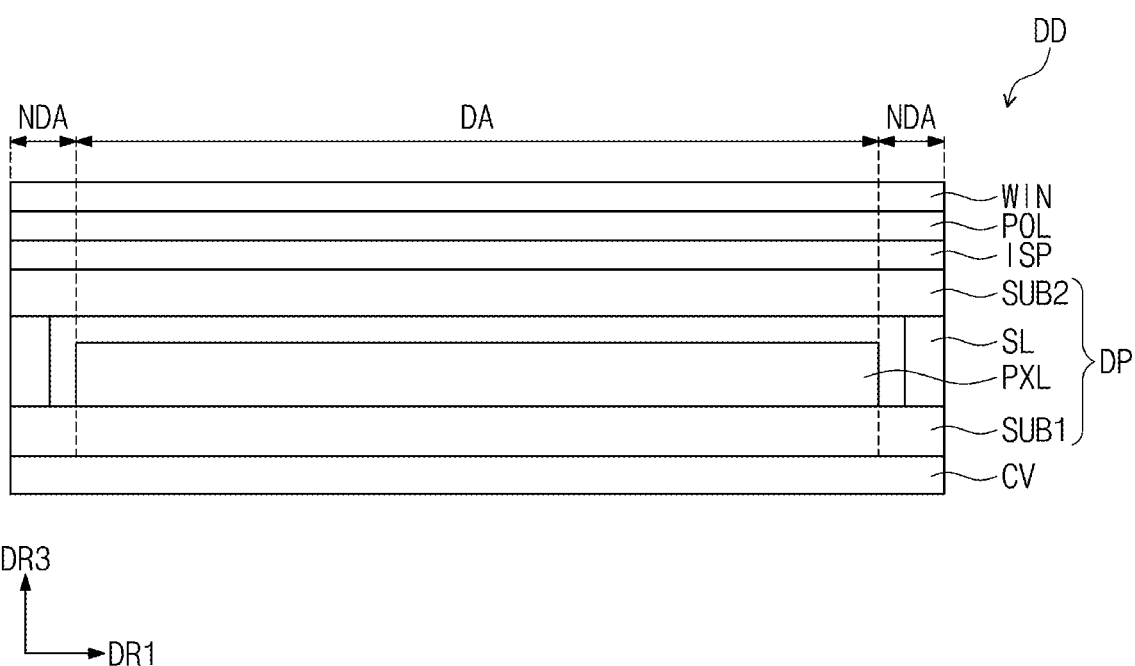
FIG. 2 is a cross-sectional view illustrating the display device shown in FIG. 1.

FIG. 2 is a cross-sectional view illustrating the display device DD shown in FIG. 1.

Referring to FIG. 2, the display device DD may include a display panel DP, an input sensing sensor in the form of an input sensing unit ISP disposed on the display panel DP, an anti-reflective layer POL disposed on the input sensing unit ISP, a window WIN disposed on the anti-reflective layer POL, and a cover panel CV disposed under the display panel DP.

The display panel DP according to some exemplary embodiments may be a light emitting type display panel, however, it should not be particularly limited. For example, the display panel DP may be an organic light emitting display panel or a quantum dot light emitting display panel, or other known display panel. A light emitting layer of the organic light emitting display panel may include an organic light emitting material. A light emitting layer of the quantum dot light emitting display panel may include a quantum dot or a quantum rod. Alternatively, the display panel DP may be a liquid crystal display panel including a liquid crystal layer. In the exemplary embodiment, the organic light emitting display panel will be described as the display panel DP.

The display panel DP may have a generally flat shape defined by short sides extending in the first direction DR1 and long sides extending in the second direction DR2. When viewed in plan, the display panel DP may have a generally rectangular shape. The display panel DP may include a first substrate SUB1, a second substrate SUB2 facing the first substrate SUB1, a pixel layer PXL, and a seal in the form of a sealing layer SL. Details of the display panel DP will be described below.

The input sensing unit ISP may be disposed on the display panel DP. The input sensing unit ISP may sense an external input, e.g., a user's touch, may convert the external input to a predetermined input signal, and may provide the input signal to the display panel DP. The input sensing unit ISP may include a plurality of sensing electrodes to sense the external input. The sensing electrodes may sense the external input by a capacitive method. The display panel DP may receive the input signal from the input sensing unit ISP and may generate an image corresponding to the input signal.

The anti-reflective layer POL may be disposed on the input sensing unit ISP. The anti-reflective layer POL may reduce a reflectance of an external light incident to the display panel DP from the outside of the display device DD. As an example, the anti-reflective layer POL may include a retarder and/or a polarizer.

The window WIN may protect the display panel DP and the input sensing unit ISP from external scratches and impacts. The window WIN may be attached to the input sensing unit ISP by an adhesive. The adhesive may include an optical clear adhesive. The image generated by the display panel DP may be provided to the user through the window WIN.

The cover panel CV may be disposed under the display panel DP. The cover panel CV may include one or more functional layers. For example, the cover panel CV may include a cushion layer. The cushion layer may be a synthetic resin foam that includes a matrix member and a plurality of voids. The voids may absorb impacts applied to the display panel DP.

Figure 3:
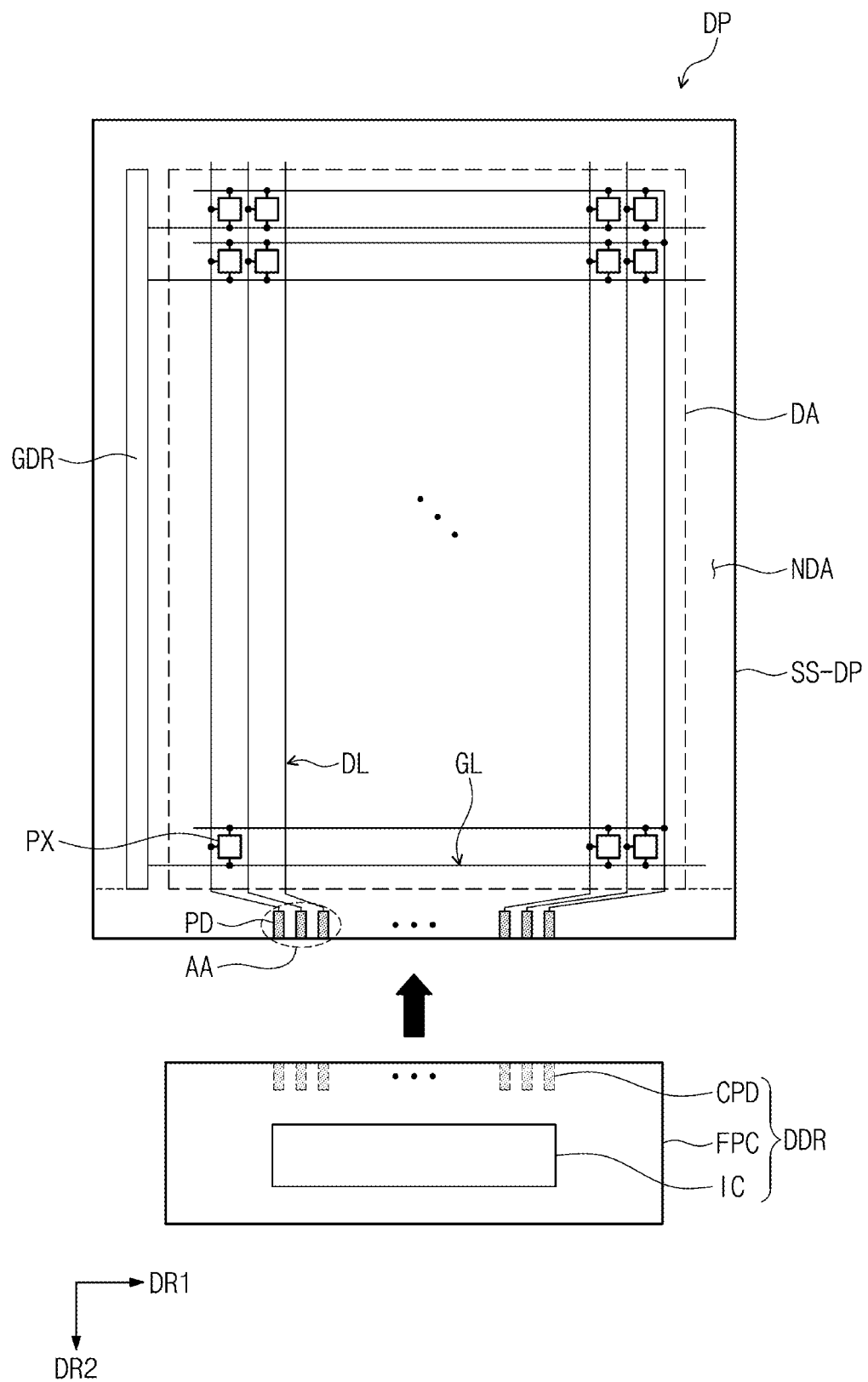
FIG. 3 is a plan view illustrating the display panel shown in FIG. 2.

FIG. 3 is a plan view illustrating the display panel DP shown in FIG. 2. For the convenience of explanation, the display panel DP is shown as being separated from a data driver DDR.

Referring to FIG. 3, the display panel DP may include a scan driver GDR, a plurality of scan lines GL, a plurality of data lines DL, a plurality of pads PD, and a plurality of pixels PX. In detail, the scan driver GDR, the scan lines GL, the data lines DL, and the pixels PX may be included in the pixel layer PXL shown in FIG. 2.

The scan driver GDR may be disposed in the non-display area NDA. The scan driver GDR may extend in the second direction DR2. The scan driver GDR may generate a plurality of scan signals and may sequentially output the scan signals to the scan lines GL.

The scan lines GL may be disposed in the display area DA. The scan lines GL may extend to the non-display area NDA. For example, the scan lines GL may extend in the first direction DR1. Ends or parts of the scan lines GL proximate to the ends of the scan lines GL extending to the non-display area NDA may be electrically connected to the scan driver GDR. The scan lines GL may be spaced apart from each other in the second direction DR2. Each scan line GL may be connected to the plural pixels PX arranged in one row.

Figure 9:
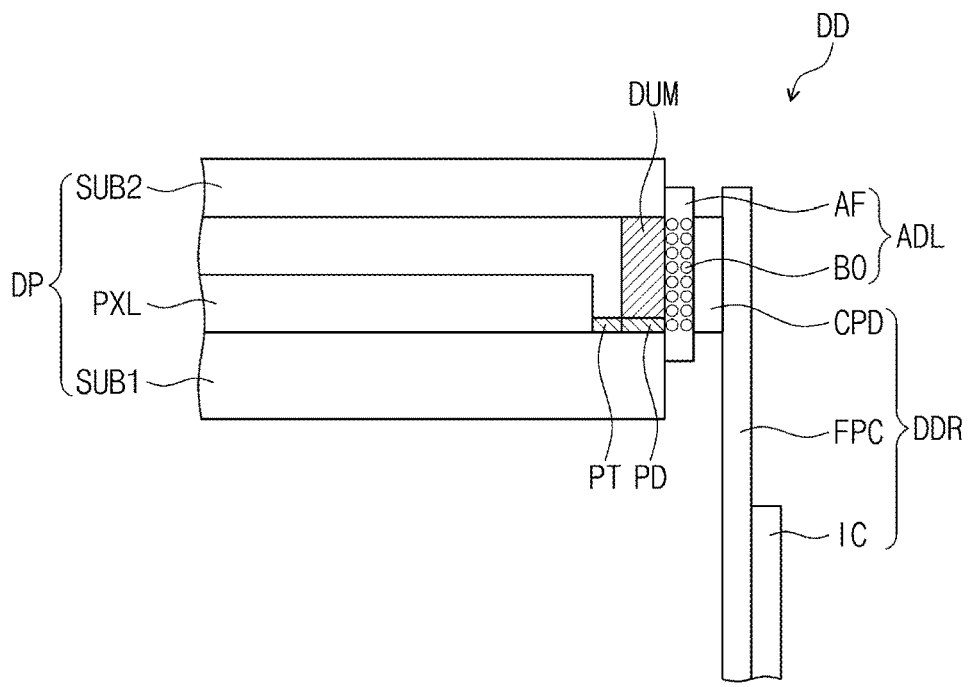
FIG. 9 is a cross-sectional view illustrating the portion AA shown in FIG. 3.

The data lines DL may be disposed in the display area DA. The data lines DL may extend to the non-display area NDA. For example, the data lines DL may extend in the second direction DR2. Respective parts PT of the data lines (as indicated at FIG. 9) near or at the ends of the data lines DL extending to the non-display area NDA may be connected to the pads PD described below. The data lines DL may be spaced apart from each other in the first direction DR1. Each data line DL may be connected to plural pixels PX arranged in one column.

The pixels PX may be disposed in the display area DA. For example, the pixels PX may be arranged in a matrix form in the display area DA, however, they should not be limited thereto or thereby. The pixels PX may be arranged in a variety of arrangements. Each of the pixels PX may be connected to a corresponding scan line among the scan lines GL and a corresponding data line among the data lines DL.

FIG. 3 further shows the data driver DDR electrically connected to the display panel DP. The data driver DDR may generate the data signals and may apply the data signals to the data lines DL.

The data driver DDR may include connection pads CPD, a flexible circuit board FPC, and a driving chip IC. The connection pads CPD may be disposed on one surface of the flexible circuit board FPC. For example, as shown in FIG. 3, the connection pads CPD may be disposed on a lower surface of the flexible circuit board FPC. The connection pads CPD may be spaced apart from each other in the first direction DR1. Each of the connection pads CPD may be connected to a corresponding pad of the pads PD described below.

The flexible circuit board FPC may be a flexible board. For example, a portion of the flexible circuit board FPC may be bent to be disposed under the display panel DP. The driving chip IC may be disposed on an opposite surface of the flexible circuit board FPC. The opposite surface of the flexible circuit board FPC may be opposite to the one surface of the flexible circuit board FPC on which the connection pads CPD are disposed. The driving chip IC may be connected to the connection pads CPD through metal lines mounted on the flexible circuit board FPC. In the illustrated exemplary embodiment, the data driver DDR may be connected to a side surface SS-DP of the display panel DP. This will be described below.

Figure 4:
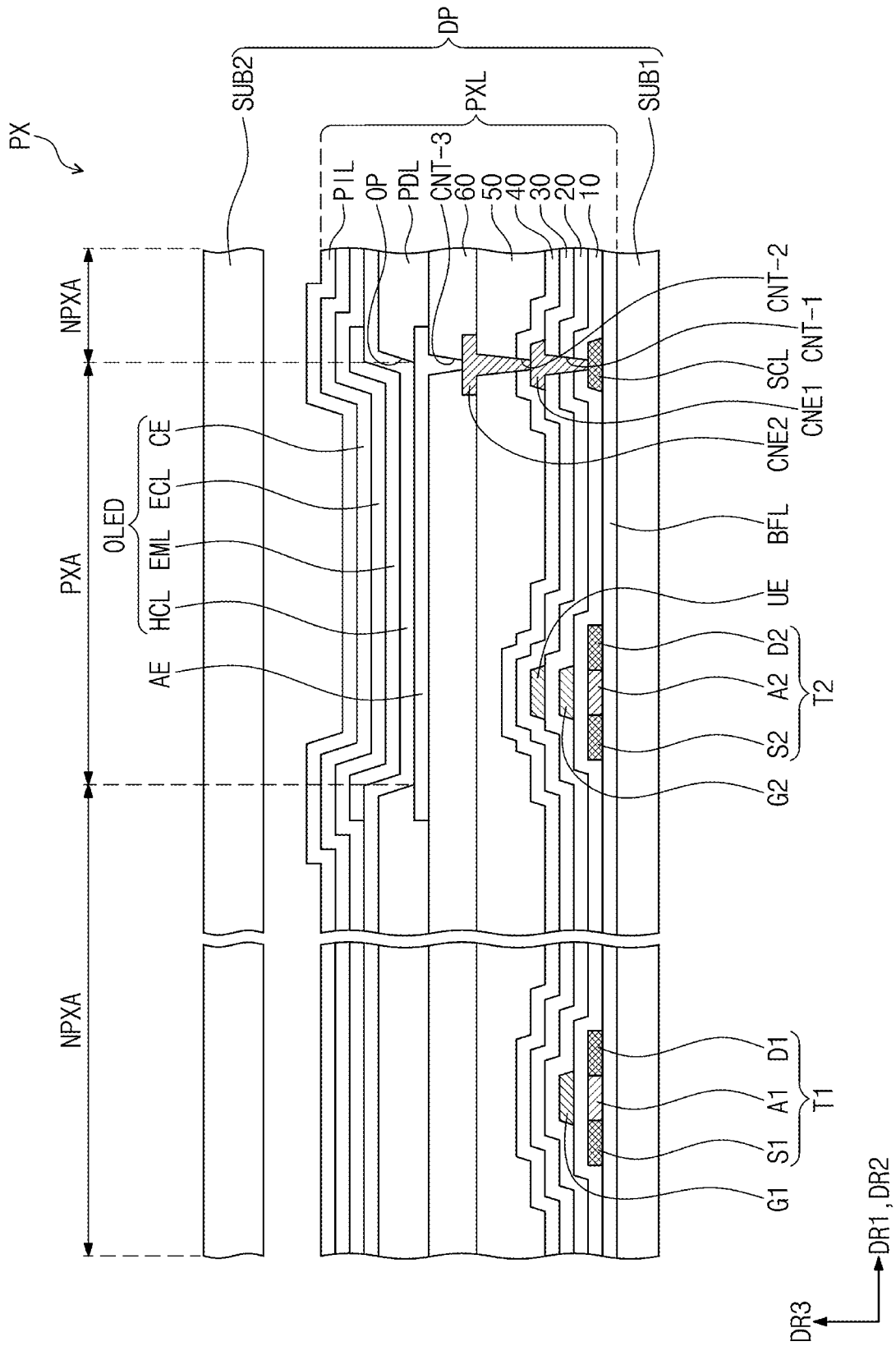
FIG. 4 is a cross-sectional view illustrating the display device shown in FIG. 2.

FIG. 4 is a cross-sectional view illustrating the display device shown in FIG. 2. Hereinafter, the structure of the pixel layer PXL shown in FIG. 2 will be described in detail with reference to FIG. 4.

Referring to FIG. 4, the display area DA may include a plurality of pixel areas PXA and a non-pixel area NPXA around each of the pixel areas PXA. FIG. 4 shows only one representative pixel area PXA, however, the pixel area PXA may be provided in plural. The non-pixel area NPXA may be disposed to surround each of the pixel areas PXA.

The pixel layer PXL may include a buffer layer BFL, a first transistor T1, a second transistor T2, a first insulating layer 10, a second insulating layer 20, a third insulating layer 30, a fourth insulating layer 40, a fifth insulating layer 50, a sixth insulating layer 60, first and second contact electrodes CNE1 and CNE2, a light emitting device OLED, and a protective layer PIL.

The buffer layer BFL may increase the coupling force between the first substrate SUB1 and a semiconductor pattern. The buffer layer BFL may include a silicon oxide layer and a silicon nitride layer, and, for example, the silicon oxide layer and the silicon nitride layer may be alternately stacked with each other.

The semiconductor pattern may be disposed on the buffer layer BFL. The semiconductor pattern may include a polysilicon, however, it should not be limited thereto or thereby. The semiconductor pattern may include an amorphous silicon or a metal oxide.

A source S1, an active A1, and a drain D1 of the first transistor T1 may be formed from the semiconductor pattern, and a source S2, an active A2, and a drain D2 of the second transistor T2 may be formed from the semiconductor pattern. The sources S1 and S2 and the drains D1 and D2 may extend in opposite directions to each other from the actives A1 and A2.

The first insulating layer 10 may be disposed on the buffer layer BFL. The first insulating layer 10 may commonly overlap the pixels PX and may cover the semiconductor pattern. The first insulating layer 10 may be an inorganic layer and/or an organic layer and may have a single-layer or multi-layer structure. The first insulating layer 10 may include at least one of an aluminum oxide, a titanium oxide, a silicon oxide, a silicon oxynitride, a zirconium oxide, and a hafnium oxide. In the illustrated exemplary embodiment, the first insulating layer 10 may have a single-layer structure of a silicon oxide layer.

Gates G1 and G2 may be disposed on the first insulating layer 10. The gate G1 may be a portion of a metal pattern. The gates G1 and G2 may overlap the actives A1 and A2, respectively. The second insulating layer 20 may be disposed on the first insulating layer 10 and may cover the gates G1 and G2. The second insulating layer 20 may commonly overlap the pixels PX. The second insulating layer 20 may be an inorganic layer and/or an organic layer and may have a single-layer or multi-layer structure. In the illustrated exemplary embodiment, the second insulating layer 20 may have a single-layer structure of a silicon oxide layer.

An upper electrode UE may be disposed on the second insulating layer 20. The upper electrode UE may overlap the gate G2 of the second transistor T2. The upper electrode UE may be a portion of metal pattern. A portion of the gate G2 and the upper electrode UE overlapping the portion of the gate G2 may define a capacitor. In some exemplary embodiments, the upper electrode UE may be omitted.

The third insulating layer 30 may be disposed on the second insulating layer 20 and may cover the upper electrode UE. In the illustrated exemplary embodiment, the third insulating layer 30 may have a single-layer structure of a silicon oxide layer. The first connection electrode CNE1 may be disposed on the third insulating layer 30. The first connection electrode CNE1 may be connected to a connection signal line SCL through a contact hole CNT-1 defined through the first, second, and third insulating layers 10, 20, and 30.

The fourth insulating layer 40 may be disposed on the third insulating layer 30. The fourth insulating layer 40 may have a single-layer structure of a silicon oxide layer. The fifth insulating layer 50 may be disposed on the fourth insulating layer 40. The fifth insulating layer 50 may be an organic layer. The second connection electrode CNE2 may be disposed on the fifth insulating layer 50. The second connection electrode CNE2 may be connected to the first connection electrode CNE1 through a contact hole CNT-2 defined through the fourth insulating layer 40 and the fifth insulating layer 50. The sixth insulating layer 60 may be disposed on the fifth insulating layer 50 and may cover the second connection electrode CNE2. The sixth insulating layer 60 may be an organic layer.

The light emitting device OLED may be disposed on the sixth insulating layer 60. A first electrode AE of the light emitting device OLED may be connected to the second connection electrode CNE2 through a contact hole CNT-3 defined through the sixth insulating layer 60. A plurality of pixel openings OP may be defined through a pixel definition layer PDL. At least a portion of the first electrode AE may be exposed through the pixel openings OP of the pixel definition layer PDL.

The pixel definition layer PDL may be disposed on the sixth insulating layer 60. The pixel definition layer PDL may overlap the non-pixel area NPXA. The pixel openings OP may be defined through the pixel definition layer PDL to overlap the pixel areas PXA.

The light emitting device OLED may be disposed in the pixel openings OP defined through the pixel definition layer PDL. The light emitting device OLED may include an organic light emitting device. For example, the light emitting device OLED may include the first electrode AE, a hole control layer HCL, a light emitting layer EML, an electron control layer ECL, and a second electrode CE.

The hole control layer HCL may be commonly disposed in the pixel area PXA and the non-pixel area NPXA. The hole control layer HCL may include a hole transport layer and may further include a hole injection layer. The light emitting layer EML may be disposed on the hole control layer HCL. The light emitting layer EML may be disposed in the area corresponding to the pixel opening OP. That is, the light emitting layer EML may be formed in each of the pixels PX after being divided into portions.

The electron control layer ECL may be disposed on the light emitting layer EML. The electron control layer ECL may include an electron transport layer and may further include an electron injection layer. The hole control layer HCL and the electron control layer ECL may be commonly formed in the plural pixels PX using an open mask. The second electrode CE may be disposed on the electron control layer ECL. The second electrode CE may be integrally formed with and commonly disposed in the pixels PX.

The protective layer PIL may be disposed on the second electrode CE. The protective layer PIL may include an inorganic material. For example, the protective layer PIL may include a silicon oxide, a silicon nitride, or a silicon oxynitride.

Figure 5:
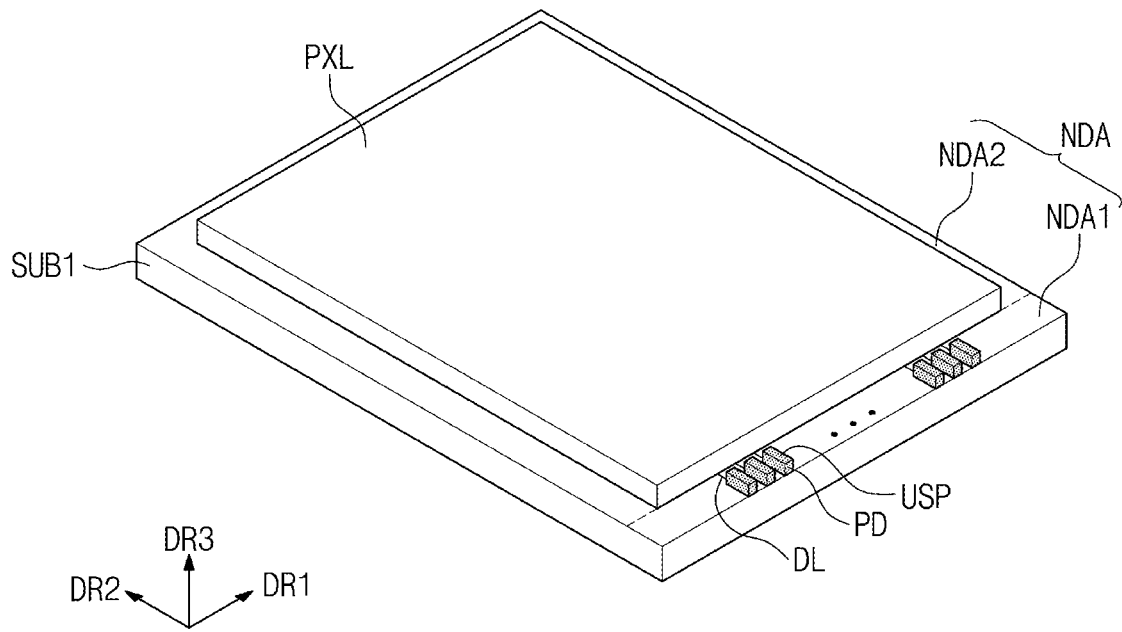
FIG. 5 is a perspective view illustrating an exemplary embodiment of a first substrate and a pixel layer disposed on the first substrate of the display panel shown in FIG. 2.

FIG. 5 is a perspective view illustrating an exemplary embodiment of a first substrate SUB1 and a pixel layer PXL disposed on the first substrate SUB1 of the display panel shown in FIG. 2. For the convenience of explanation, the pixel layer PXL is briefly shown below.

Referring to FIGS. 2 and 5, the first substrate SUB1 may have a generally flat shape defined by short sides in the first direction DR1 and long sides in the second direction DR2. When viewed in plan, the first substrate SUB1 may have a generally rectangular shape. However, the shape of the first substrate SUB1 should not be limited to the generally rectangular shape. The shape of the first substrate SUB1 may be changed in various ways depending on the shape of the display device DD (refer to FIG. 1).

The first substrate SUB1 may be a generally rigid substrate. For example, the first substrate SUB1 may be a glass substrate. The first substrate SUB1 may include the display area DA and a non-display area NDA surrounding the display area DA. The display area DA and the non-display area NDA of the first substrate SUB1 may substantially correspond to the display area DA and the non-display area NDA of the display surface DS shown in FIG. 1, respectively.

The pixel layer PXL may be disposed on the first substrate SUB1. The pixel layer PXL may be disposed in the display area DA of the first substrate SUB1. The pixel layer PXL may include the pads PD. The pads PD may be disposed in the non-display area NDA.

In detail, the non-display area NDA may include a first non-display area NDA1 extending along one of the short sides of the substrate SUB1 and a second non-display area NDA2 extending along the other short side and two opposing longer sides of the substrate SUB1. The first non-display area NDA1 may be the area of the non-display area NDA in which the pads PD are disposed. The second non-display area NDA2 may be the area of the non-display area NDA except for the first non-display area NDA1.

When viewed in plan, each pad PD may have a generally rectangular shape. The pads PD may be spaced apart from each other in the first direction DR1. The pads PD may include a conductive material. For example, the pads PD may include a metal material. Each pad PD may be electrically connected to one data line DL, however, it should not be limited thereto or thereby. Each pad PD may be connected to plural data lines DL.

Figure 6:
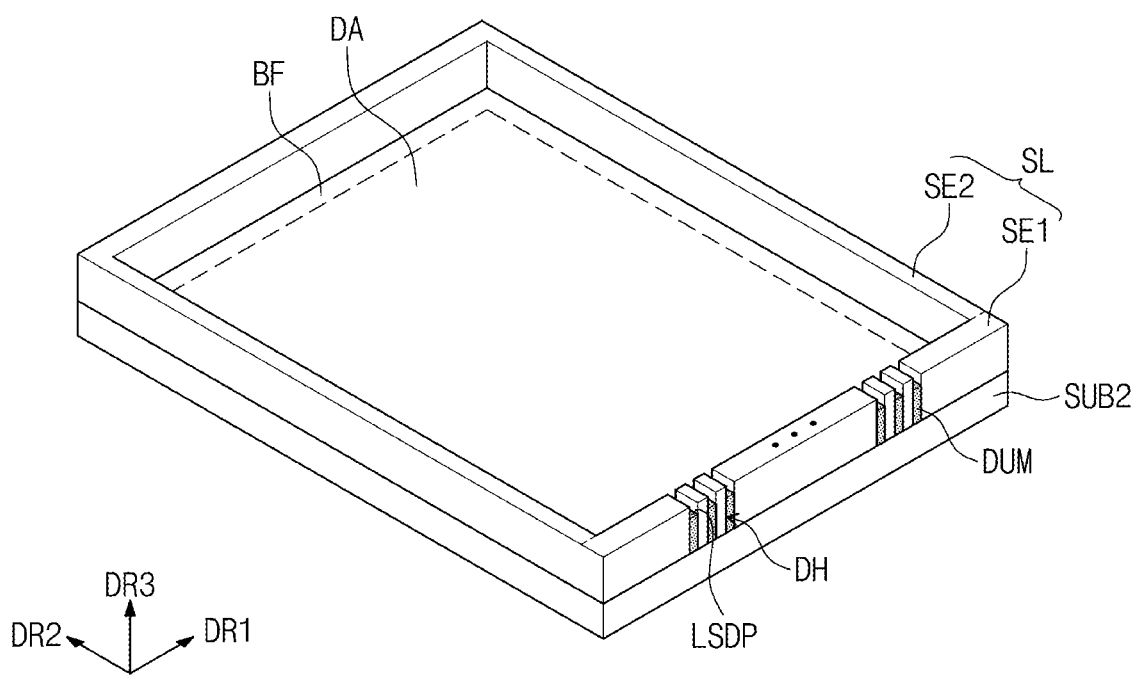
FIG. 6 is a perspective view illustrating an exemplary embodiment of a second substrate and a sealing layer disposed on the second substrate of the display panel shown in FIG. 2.

FIG. 6 is a perspective view illustrating an exemplary embodiment of a second substrate SUB2 and a sealing layer SL disposed on the second substrate of the display panel shown in FIG. 2.

Figure 7:
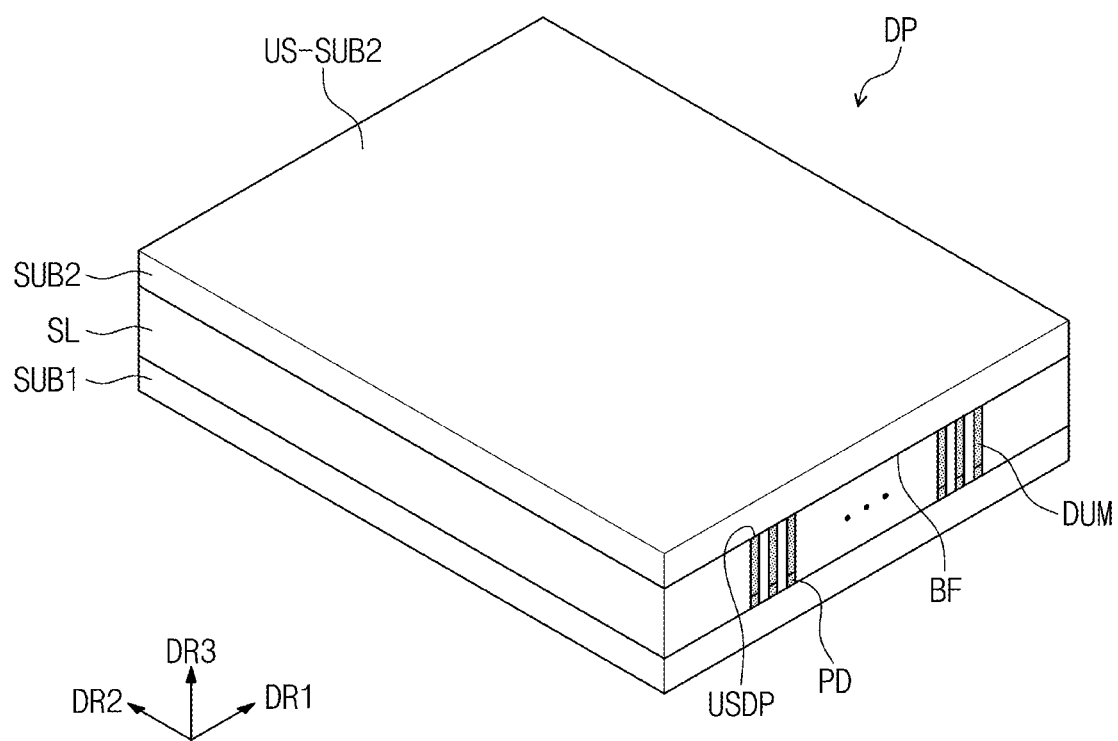
FIG. 7 is a perspective view illustrating the display panel with the first substrate shown in FIG. 1 connected with the second substrate and a sealing layer shown in FIG. 6.

For the convenience of explanation, an upper surface US-SUB2, as depicted in FIG. 7, and a lower surface BF of the second substrate SUB2 are shown inverted in FIG. 6.

Referring to FIGS. 2 and 6, the second substrate SUB2 may have a generally flat shape defined by short sides extending in the first direction DR1 and long sides extending in the second direction DR2. When viewed in plan, the second substrate SUB2 may have a generally rectangular shape. However, the shape of the second substrate SUB2 should not be limited to the generally rectangular shape. The second substrate SUB2 may be an encapsulation layer. For example, the second substrate SUB2 may include a glass substrate.

The sealing layer SL may be disposed on the lower surface BF of the second substrate SUB2. The sealing layer SL may overlap the non-display area NDA (refer to FIG. 5). The sealing layer SL may disposed along an edge of the second substrate SUB2.

In detail, the sealing layer SL may include a first sealing portion SE1 and a second sealing portion SE2. The first sealing portion SE1 may extend in the first direction DR1. The first sealing portion SE1 may overlap the first non-display area NDA1.

The second sealing portion SE2 may overlap the second non-display area NDA2. For example, the second sealing portion SE2 may include two sealing lines extending in the second direction DR2 and one sealing line extending in the first direction DR1. The second sealing portion SE2 may have a U bracket shape, e.g., "⊏". End portions of the sealing lines extending in the second direction DR2 from the second sealing portion SE2 may be connected to the first sealing portion SE1. Accordingly, the first and second sealing portions SE1 and SE2 may have a generally quadrangular frame shape.

The first sealing portion SE1 and the second sealing portion SE2 may include an insulating material. For example, the first sealing portion SE1 and the second sealing portion SE2 may include a glass material. However, the material for the first and second sealing portions SE1 and SE2 should not be limited thereto or thereby. The first and second sealing portions SE1 and SE2 may include an organic insulating material.

The first sealing portion SE1 may be provided with a plurality of holes in the form of dummy holes DH defined therethrough. The dummy holes DH may be spaced apart from each other in the first direction DR1. Each of the dummy holes DH may have substantially the same width as the width of the pad PD (refer to FIG. 5) in the first direction DR1.

The display panel DP may include a plurality of dummy elements in the form of dummy patterns DUM, which are not electrically connected to the signal lines or other electrical components of the display device, but used for other purposes, such as, to provide a larger surface area for connections and/or to space other structural elements. The dummy patterns DUM may be disposed in the dummy holes DH defined through the sealing layer SL, respectively. In detail, the dummy patterns DUM may be disposed in the dummy holes DH of the first sealing portion SE1 overlapping the first non-display area NDA1. The dummy patterns DUM may be spaced apart from each other in the first direction DR1. The dummy pattern DUM may have substantially the same width as the width of the pad PD in the first direction DR1.

The dummy patterns DUM may be stepped from a portion of the sealing layer SL adjacent to the dummy patterns DUM. For example, one surface of the first sealing portion SE1 and one surface of the dummy patterns DUM may be in contact with the lower surface of the second substrate SUB2. The first sealing portion SE1 may have a thickness greater than the thickness of the dummy patterns DUM in the third direction DR3. Thus, a difference in height (step difference) may be formed between the first sealing portion SE1 and the dummy patterns DUM. The step difference between the first sealing portion SE1 and the dummy patterns DUM may correspond to the thickness in the third direction DR3 of the pads PD shown in FIG. 5.

FIG. 7 is a perspective view illustrating the display panel DP with the first substrate SUB1 shown in FIG. 1 connected with the second substrate SUB2 and a sealing layer SL shown in FIG. 6.

Referring to FIG. 7, the dummy patterns DUM may be disposed on the pads PD. The dummy patterns DUM may be in contact with the pads PD. In detail, each of the lower surfaces LSDP (as depicted in FIG. 6) of the dummy patterns DUM may be in contact with an upper surface USP (as depicted in FIG. 5) of a corresponding pad PD among the pads PD. The dummy patterns DUM may include a conductive material. For example, the dummy patterns DUM may include a metal material. The dummy patterns DUM may be electrically connected to the pads PD.

The upper surface USDP of the dummy patterns DUM may be in contact with a lower surface BF of the second substrate SUB2. An upper surface of the sealing layer SL may be in contact with the lower surface BF of the second substrate SUB2, and a lower surface of the sealing layer SL may be in contact with the upper surface of the first substrate SUB1. Accordingly, the sealing layer SL and the dummy patterns DUM may seal the pixel layer PXL (refer to FIG. 2) disposed on the first substrate SUB1 from the external environment together with the second substrate SUB2. That is, the second substrate SUB2, the dummy patterns DUM, and the sealing layer SL may prevent moisture and other contaminants from infiltrating the pixel layer PXL disposed on the first substrate SUB1, and thus, defects of the light emitting device may be reduced or prevented.

Figure 8:
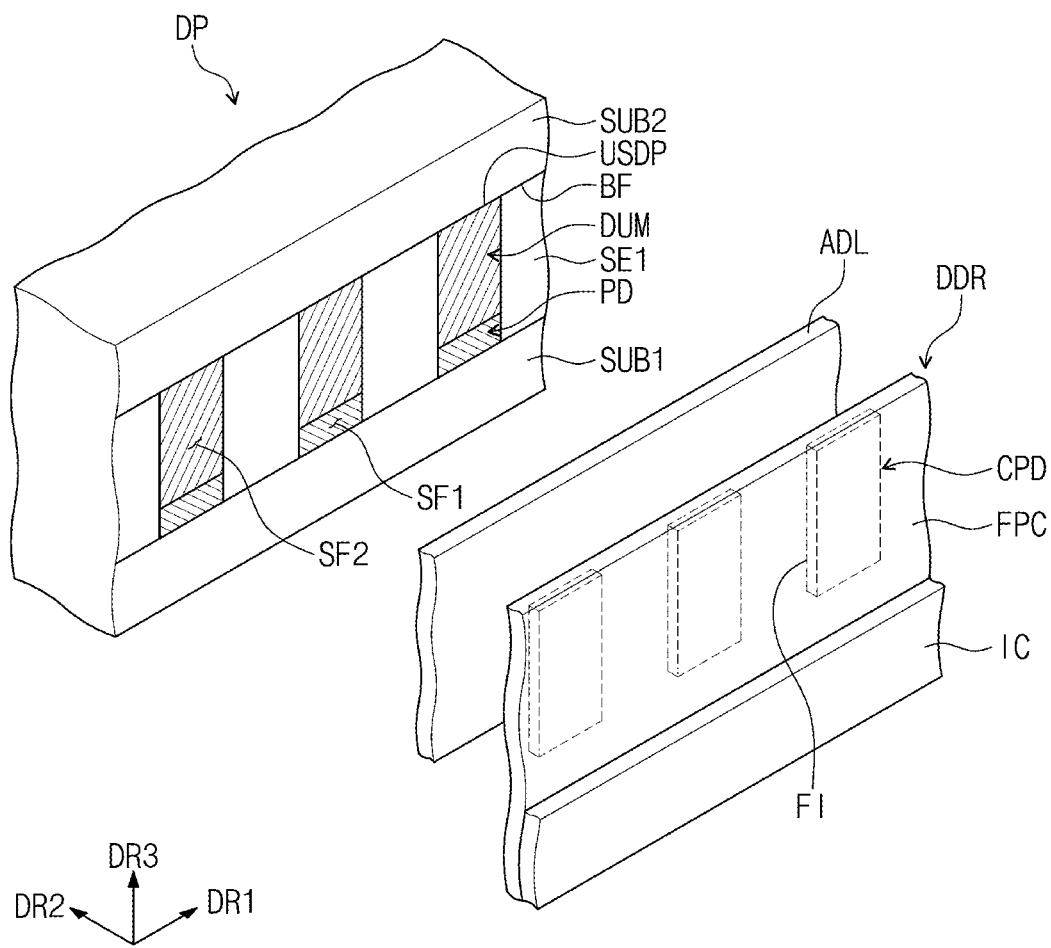
FIG. 8 is an exploded perspective view illustrating a portion AA shown in FIG. 3.

FIG. 8 is an exploded perspective view illustrating a portion AA shown in FIG. 3, and FIG. 9 is a cross-sectional view illustrating the portion AA shown in FIG. 3. For the convenience of explanation, FIG. 9 shows a structure in which the data driver DDR is connected with the display panel DP.

Referring to FIGS. 3, 8, and 9, the data driver DDR may be disposed on the side surface of the display panel DP. The data driver DDR may be electrically connected to the data lines DL through the pads PD.

In detail, first surfaces F1 of the connection pads CPD may face first side surfaces SF1 of the pads PD and second side surfaces SF2 of the dummy patterns DUM. The first surface F1 may be opposite to a surface that faces the flexible circuit board FPC. The first side surfaces SF1 may be surfaces exposed to the outside of the display panel DP. The second side surfaces SF2 may be surfaces exposed to the outside of the display panel DP. The first side surfaces SF1 of the pads PD and the second side surfaces SF2 of the dummy patterns DUM may be disposed in substantially the same plane.

An adhesive layer ADL may be disposed between the display panel DP and the data driver DDR. The adhesive layer ADL may fix the data driver DDR to the side surface of the display panel DP. For example, the adhesive layer ADL may be an anisotropic conductive film (ACF). The adhesive layer ADL may include an adhesive film AF and a plurality of conductive balls BO. One surface of the adhesive film AF may be in contact with the first side surfaces SF1 of the pads PD, the second side surfaces SF2 of the dummy patterns DUM, a portion of the side surface of the first substrate SUB1, and a portion of the side surface of the second substrate SUB2. An opposite surface of the adhesive film AF, which is opposite to the one surface of the adhesive film AF, may be in contact with the first surfaces F1 of the connection pads CPD.

The conductive balls BO may be at least partially or completely disposed in the adhesive film AF, as shown schematically in FIG. 9. The conductive balls BO may be arranged between the first and second side surfaces SF1 and SF2 and the connection pads CPD. The conductive balls BO may include a conductive material. Accordingly, each of the connection pads CPD may be electrically connected to a corresponding pad PD and a corresponding dummy pattern DUM.

According to some exemplary embodiments, the data driver DDR connected to the data lines DL may be disposed on the side surface of the display panel DP, and thus, the area of the bezel of the display device DD may be reduced.

According to some exemplary embodiments, since the dummy patterns DUM are electrically connected to the pads PD and the connection pads CPD are electrically connected to the pads PD and the dummy patterns DUM, the area in which the display panel DP and the data driver DDR are electrically connected to each other may increase. Accordingly, the contact resistance between the connection pad CPD and the pad PD may decrease, and thus, the display panel DP and the data driver DDR may be stably connected to each other.

In the illustrated exemplary embodiment, the dummy patterns DUM are disposed on the pad PD connected to the data driver DDR, however, the dummy patterns DUM may be disposed on the pad connected to the scan driver GDR. For instance, the scan driver GDR is disposed in the non-display area NDA in the above descriptions (refer to FIG. 3), however, the scan driver GDR may be disposed on the side surface of the display panel DP after being separately manufactured similar to the data driver DDR. In this case, the dummy patterns DUM may be also disposed on the pads of the display panel DP connected to the scan driver GDR.

Hereinafter, the display device according to another exemplary embodiment will be described. In the following descriptions, the same reference numerals denote the same elements in the above-described exemplary embodiments. Thus, detailed descriptions of the same element will be omitted to avoid redundancy, and different features will be mainly described in detail.

FIGS. 10 to 13 are views illustrating other exemplary embodiments of display devices DD-1, DD-2, and DD-3 constructed according to principles of the invention.

Figure 10:
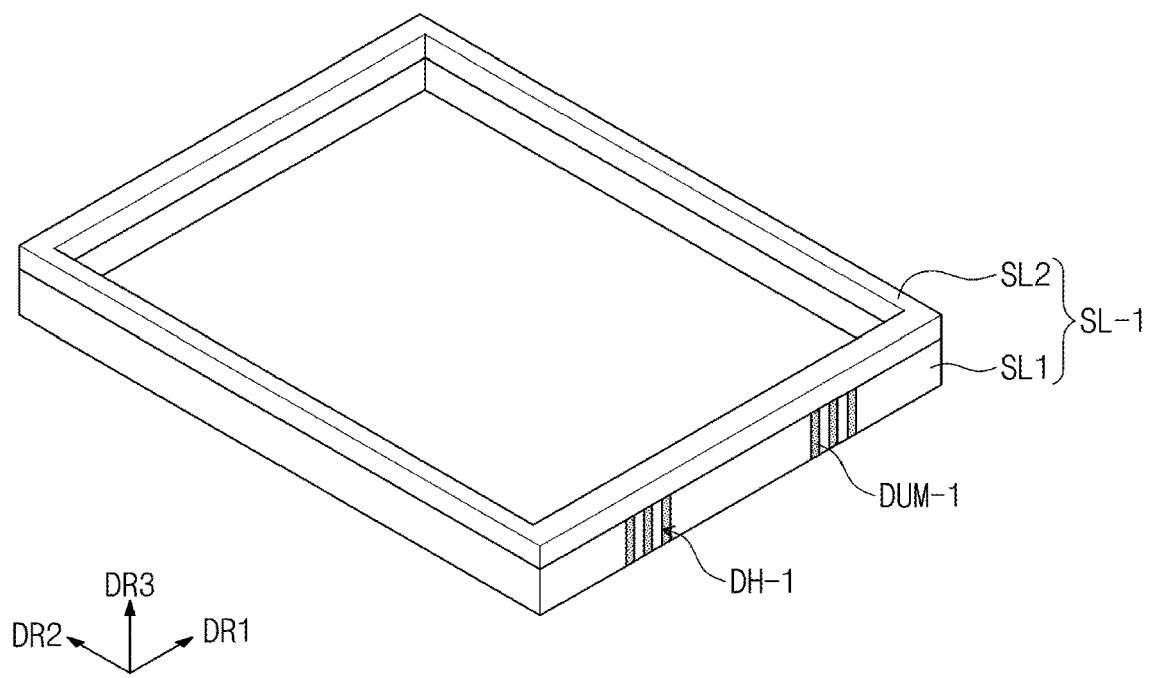
FIGS. 10 to 13 are views illustrating other exemplary embodiments of a display device constructed according to principles of the invention.
Figure 11:
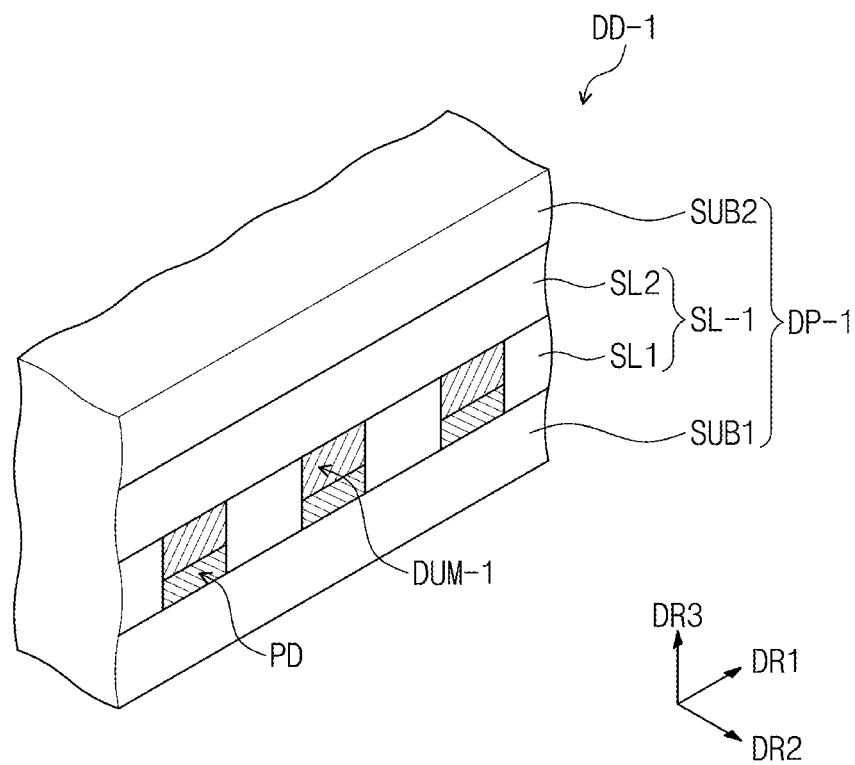

Referring to FIGS. 10 and 11, a sealing layer SL-1 of a display panel DP-1 may include a plurality of layers in the display device DD-1. For example, the sealing layer SL-1 may include a first sealing layer SL1 and a second sealing layer SL2. The first sealing layer SL1 may be disposed on a first substrate SUB1, and the second sealing layer SL2 may be disposed on the first sealing layer SL1.

A plurality of dummy holes DH-1 may be defined through the first sealing layer SL1. A plurality of dummy patterns DUM-1 may be disposed in the dummy holes DH-1, respectively. The second sealing layer SL2 may be disposed on the first sealing layer SL1 to cover the dummy patterns DUM-1.

Because the display device DD-1 further includes the second sealing layer SL2 disposed on the first sealing layer SL1 in which the dummy patterns DUM-1 are disposed, the overall mechanical strength of the sealing layer SL-1 may increase. Accordingly, the sealing layer SL-1 may stably protect the pixel layer PXL.

Figure 12:
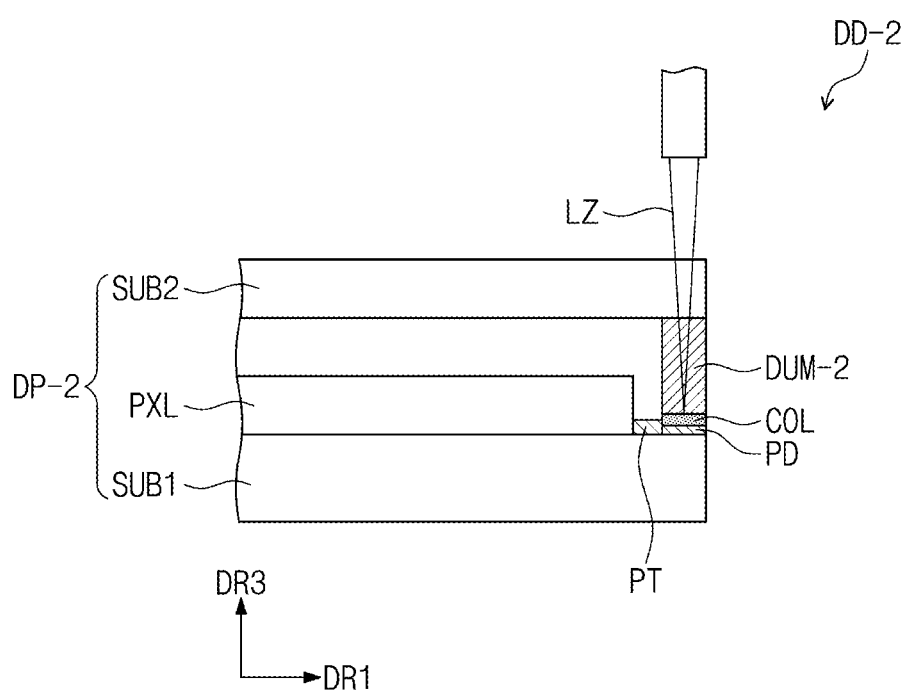

Referring to FIG. 12, a dummy pattern DUM-2 and a pad PD may be integrally formed with each other. In detail, the display device DD-2 may further include a connection layer COL. The connection layer COL may be disposed between a lower surface of a dummy pattern DUM-2 and an upper surface of the pad PD. The connection layer COL may be formed by cooling a material in which a portion of the dummy pattern DUM-2 and a portion of the pad PD are melted. For example, the connection layer COL may be formed by irradiating a laser beam LZ onto a contact surface between the dummy pattern DUM-2 and the pad PD. The laser beam LZ may be a microwave pulse laser.

When the laser beam LZ is irradiated onto the contact surface between the dummy pattern DUM-2 and the pad PD, a temperature of the contact surface may increase. Accordingly, the portion of the dummy pattern DUM-2 and the portion of the pad PD, which are adjacent to the contact surface, may be melted. When the irradiation of the laser beam LZ is finished, the temperature of the contact surface may decrease. Therefore, the melted material may be cooled, and thus, the connection layer COL may be formed.

According to some exemplary embodiments, the pad PD and the dummy pattern DUM-2 may be integrally formed with each other by the connection layer COL, and thus, the pad PD and the dummy pattern DUM-2 may be securely coupled to each other. Accordingly, a phenomenon in which external moisture or other contaminants enter the pixel layer PXL through a space between the dummy pattern DUM-2 and the pad PD may be effectively prevented.

Figure 13:
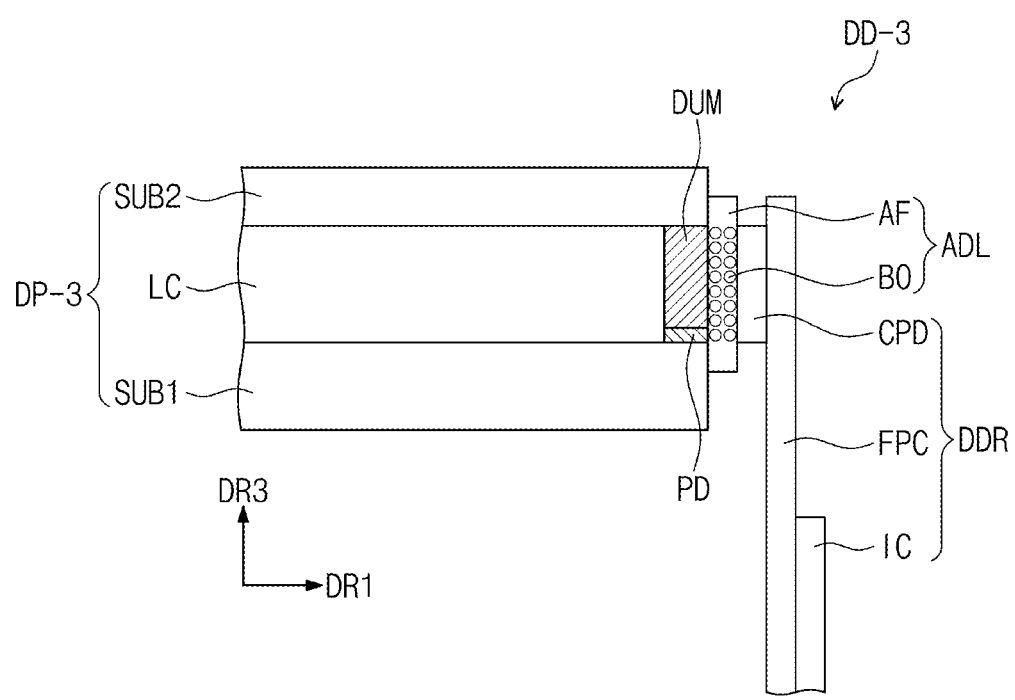

Referring to FIG. 13, the display device DD-3 having display panel DP-3 may be a liquid crystal display device. For example, a liquid crystal layer LC may be disposed between a first substrate SUB1 and a second substrate SUB2. The liquid crystal layer LC may include a plurality of liquid crystal molecules. A pixel electrode may be disposed on the first substrate SUB1, and a common electrode may be disposed under the second substrate SUB2. The liquid crystal molecules may be driven by an electric field formed between the pixel electrode and the common electrode. The light transmittance of the display device DD-3 may be controlled by the liquid crystal molecules, and thus, the image may be displayed. As described above, the dummy patterns DUM according to the exemplary embodiment may be applied to a liquid crystal display panel in addition to the organic light emitting display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
 a first substrate including a display area and a non-display area at least partially surrounding the display area;
 a second substrate disposed on the first substrate;
 a pixel layer disposed on the display area between the first substrate and the second substrate;
 a seal disposed on the non-display area between the first substrate and the second substrate;
 a pad connected to the pixel layer and disposed on the non-display area; and
 a dummy element in a hole in the seal, the dummy element being disposed on the pad,
 wherein a lower surface of the dummy element is in contact with an upper surface of the pad.

2. The display device of claim 1, wherein the pixel layer comprises:
 a pixel;
 a scan line connected to the pixel; and a data line connected to the pixel and extending to the non-display area, the data line comprising a part near or at an end of the data line connected to the pad.

3. The display device of claim 1, wherein an upper surface of the dummy element is in contact with a lower surface of the second substrate.

4. The display device of claim 1, further comprising a data driver connected to the pad, wherein the data driver comprises:
a flexible circuit board;
a connection pad disposed on one surface of the flexible circuit board and connected to the pad; and
a driving chip mounted on the flexible circuit board.

5. The display device of claim 4, wherein the connection pad is electrically connected to a first side surface of the pad, which faces the connection pad, and a second side surface of the dummy element, which faces the connection pad.

6. The display device of claim 5, wherein the first side surface and the second side surface are disposed in substantially a same plane.

7. The display device of claim 1, wherein the dummy element is integral with the pad.

8. The display device of claim 1, wherein the pixel layer comprises an organic light emitting device.

9. The display device of claim 1, further comprising a liquid crystal layer disposed between the first substrate and the second substrate.

10. The display device of claim 1, wherein the dummy element comprises a metal material.

11. A display device comprising:
a first substrate including a display area and a non-display area at least partially surrounding the display area;
a second substrate disposed on the first substrate;
a pixel layer disposed on the display area between the first substrate and the second substrate;
a seal disposed on the non-display area between the first substrate and the second substrate;
a pad connected to the pixel layer and disposed on the non-display area; and
a dummy element in a hole in the seal, the dummy element being disposed on the pad,
wherein the dummy element comprises a dummy pattern, the hole comprises a dummy hole, and at least one of the pad, the dummy pattern, and the dummy hole is disposed in plural, the pads, the dummy patterns, and the dummy holes extend in a first direction.

12. The display device of claim 11, wherein the seal comprises a sealing layer including:
a first sealing layer disposed on the first substrate having dummy holes in which the dummy patterns are received; and
a second sealing layer disposed on the first sealing layer.

13. The display device of claim 12, wherein the second sealing layer is disposed on the first sealing layer to overlap the dummy patterns.

14. A display device comprising:
a first substrate including a display area and a non-display area at least partially surrounding the display area;
a second substrate disposed on the first substrate;
a pixel layer disposed on the display area between the first substrate and the second substrate;
a seal disposed on the non-display area between the first substrate and the second substrate;
a pad connected to the pixel layer and disposed on the non-display area;
a dummy element in a hole in the seal, the dummy element being disposed on the pad; and
a data driver connected to the pad, wherein the data driver comprises:
a flexible circuit board;
a connection pad disposed on one surface of the flexible circuit board and connected to the pad; and
a driving chip mounted on the flexible circuit board,
wherein the connection pad is electrically connected to a first side surface of the pad, which faces the connection pad, and a second side surface of the dummy pattern, which faces the connection pad; and
an adhesive layer disposed between the connection pad and the first side surface and between the connection pad and the second side surface.

15. The display device of claim 14, wherein the adhesive layer comprises:
an adhesive film; and
a plurality of conductive balls at least partially disposed in the adhesive film.

16. A display device comprising:
a first substrate including a display area and a non-display area at least partially surrounding the display area;
a second substrate disposed on the first substrate;
a pixel disposed on the display area between the first substrate and the second substrate;
a data line connected to the pixel on the display area and extending in a first direction to be disposed on the non-display area;
a pad disposed on the non-display area and connected to at or near an end of the data line;
a seal disposed on the non-display area between the first substrate and the second substrate; and
a dummy element overlapping the seal and connected to the pad,
wherein a lower surface of the dummy element is in contact with a lower surface of the second substrate.

17. The display device of claim 16, wherein the dummy element is received in a hole defined in the seal.

18. The display device of claim 16, further comprising a data driver configured to communicate a data signal to the data line, wherein the data driver comprises:
a flexible circuit board;
a connection pad disposed on one surface of the flexible circuit board and connected to the pad and the dummy element; and
a driving chip mounted on the flexible circuit board, and the connection pad being connected to a first side surface of the pad which faces the connection pad, and a second side surface of the dummy pattern which faces the connection pad.

19. The display device of claim 16, wherein the seal comprises a sealing layer including an insulating material, and the dummy element comprises dummy pattern including a metal material.

* * * * *